US009313918B2

(12) United States Patent
Lee et al.

(10) Patent No.: US 9,313,918 B2
(45) Date of Patent: Apr. 12, 2016

(54) COOLING DEVICE FOR ELECTRONIC MACHINE

(71) Applicant: SAMSUNG ELECTRONICS CO., LTD., Suwon-si (KR)

(72) Inventors: Wook Jin Lee, Seoul (KR); Sung Tae Kim, Hwaseong-si (KR); Yong Ho Lee, Suwon-si (KR); Young Chal Park, Suwon-si (KR); Se Hoon Shin, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 203 days.

(21) Appl. No.: 14/063,578

(22) Filed: Oct. 25, 2013

(65) Prior Publication Data
US 2014/0118940 A1    May 1, 2014

(30) Foreign Application Priority Data

Oct. 26, 2012 (KR) .................. 10-2012-0119723

(51) Int. Cl.
*H05K 7/20* (2006.01)
(52) U.S. Cl.
CPC .................. *H05K 7/20154* (2013.01)
(58) Field of Classification Search
CPC .......... H05K 7/20136; H05K 7/20145; H05K 7/20154; H05K 7/20163; H05K 7/20181
USPC ............... 361/688–723; 165/80.1–80.3, 185; 454/184–186, 228–253
See application file for complete search history.

(56) References Cited

U.S. PATENT DOCUMENTS

| 5,828,549 A | * | 10/1998 | Gandre et al. | 361/695 |
| 5,912,802 A | * | 6/1999 | Nelson | 361/695 |
| 6,940,716 B1 | * | 9/2005 | Korinsky et al. | 361/695 |
| 2003/0030980 A1 | * | 2/2003 | Bird et al. | 361/694 |
| 2004/0125558 A1 | * | 7/2004 | DiStefano | 361/687 |
| 2004/0207983 A1 | * | 10/2004 | Lu et al. | 361/695 |
| 2009/0241454 A1 | * | 10/2009 | Yeh et al. | 52/473 |

* cited by examiner

*Primary Examiner* — Anthony Haughton
*Assistant Examiner* — Yahya Ahmad
(74) *Attorney, Agent, or Firm* — Staas & Halsey LLP

(57) ABSTRACT

A cooling device for an electronic machine includes an airflow channel through which external air passes, an air inlet duct through which external air is introduced and which is disposed at an upper front surface of the airflow channel and extends perpendicularly to the airflow channel, a blower fan disposed in the air inlet duct to draw in external air through the air inlet duct, an air outlet duct disposed at a lower portion of the airflow channel to discharge air from the airflow channel, and a heat-radiating unit disposed to the rear of a circuit board mounted with electronic components on a front surface thereof to absorb heat from the circuit board. The heat-radiating unit is located, apart from the blower fan, in the airflow channel. Through the improved cooling airflow structure, cooling efficiency is increased, noise is reduced and continuous cooling operation is achieved.

29 Claims, 10 Drawing Sheets

COOLING DEVICE FOR ELECTRONIC MACHINE

CROSS-REFERENCE TO RELATED APPLICATIONS

This application claims the priority benefit of Korean Patent Application No. 10-2012-0119723, filed on Oct. 26, 2012, in the Korean Intellectual Property Office, the disclosure of which is incorporated herein by reference.

BACKGROUND

1. Field

The following description relates to a cooling device for an electronic machine having an improved cooling airflow structure for a heat-radiating unit.

2. Description of the Related Art

Electronic machines, such as air conditioners, boilers and the like, are equipped with a control box containing various electronic components. When an electronic machine operates, electronic components of a control box generate heat. However, if the heat generated from the electronic components of the control box is not adequately dissipated, malfunction of the machine may occur.

Accordingly, a control box is provided with a cooling device. A conventional cooling device is structured such that heat-radiating plates are provided above a circuit board and a fan is provided above the heat-radiating plates to blow air toward the heat-radiating plates or draw heated air from the heat-radiating plates.

However, if dusts or foreign matter adhere to the fan, cooling efficiency may be decreased, or noise may occur. Further, deterioration of lift and performance of the fan due to heat generated from the circuit board may occur.

SUMMARY

It is an aspect of the present disclosure to provide a cooling device for an electronic machine which is equipped with a cooling airflow structure capable of reducing noise and performing continuous cooling operation.

It is another aspect of the present disclosure to provide a cooling device for an electronic machine which is equipped with a cooling airflow structure capable of ensuring a smooth cooling airflow by preventing air congestion.

Additional aspects of the disclosure will be set forth in part in the description which follows and, in part, will be apparent from the description, or may be learned by practice of the disclosure.

In accordance with one aspect of the present disclosure, a cooling device for an electronic machine includes an airflow channel through which external air passes, an air inlet duct through which external air is introduced, the air inlet duct being disposed at an upper front portion of the airflow channel and extending perpendicular to the airflow channel, a blower fan disposed in the air inlet duct to draw in external air through the air inlet duct, an air outlet duct disposed at a lower portion of the airflow channel to discharge air having passed through the airflow channel outside, and a heat-radiating unit disposed to a rear portion of a circuit board mounted with electronic components on a front surface thereof to absorb heat generated from the circuit board, the heat-radiating unit being located, apart from the blower fan, in a passage of the airflow channel.

The heat-radiating unit may include a plurality of heat-radiating plates which are formed to extend in the same direction as air current in the airflow channel.

The airflow channel may include a front plate provided with the air inlet duct, a rear plate provided with the heat-radiating unit, and a side plate connecting the front plate and the rear plate. The heat-radiating unit may be removably located at the rear plate.

The rear plate may be provided with sliding units at a top end portion and a bottom end portion thereof for sliding movement sideways.

The heat-radiating unit may be removably provided over a portion of the rear plate of the airflow channel.

The airflow channel may have the same cross-sectional shape as the heat-radiating unit.

The airflow channel may be provided with a guide member near each of side surfaces of the heat-radiating unit to concentrate airflow in the airflow channel onto the heat-radiating unit.

The airflow channel may be provided with bypass passages at positions opposite to the air inlet duct and the air outlet duct to decrease air congestion.

The air inlet duct and the air outlet duct may be arranged in parallel with each other.

The cooling device may further include louvers mounted to the air inlet duct and the air outlet duct to prevent water from entering the airflow channel from the outside.

In accordance with another aspect of the present disclosure, a cooling device for an electronic machine includes an air inlet duct through which external air is introduced, an airflow channel arranged perpendicularly to the air inlet duct, an air outlet duct disposed at a lower portion of the airflow channel to discharge air having passed through the airflow channel, and a heat-radiating unit disposed to the rear of a circuit board mounted with electronic components on a front surface thereof to absorb heat generated from the circuit board, the heat-radiating unit being enveloped by an inner wall of the airflow channel.

The cooling device may further include a blower fan disposed in the air inlet duct to draw external air into the airflow channel.

The heat-radiating unit may include a plurality of heat-radiating plates which are formed to extend in the same direction as air current in the airflow channel.

The heat-radiating unit may be arranged in parallel with the blower fan.

The airflow channel may be provided with a guide member near each of side surfaces of the heat-radiating unit to concentrate airflow in the airflow channel onto the heat-radiating unit.

The airflow channel may include a front plate provided with the air inlet duct, a rear plate provided with the heat-radiating unit, and a side plate connecting the front plate and the rear plate. The heat-radiating unit may be removably located at the rear plate.

The rear plate may be provided with sliding units at a top end portion and a bottom end portion thereof for sliding movement sideways.

The heat-radiating unit may be removably provided over a portion of the rear plate of the airflow channel.

The airflow channel may be provided with bypass passages at positions opposite to the air inlet duct and the air outlet duct to decrease air congestion.

The cooling device may further include louvers mounted to the air inlet duct and the air outlet duct to prevent water from entering the airflow channel from the outside.

In accordance with a further aspect of the present disclosure, a cooling device for an electronic machine includes a heat-radiating unit disposed to the rear of a circuit board mounted with electronic components on a front surface thereof, an airflow channel configured to envelop the heat-radiating unit so that external air flowing in the airflow channel may cool the heat-radiating unit, an air inlet duct disposed at an upper portion of the airflow channel, through which external air is introduced, an air outlet duct disposed below the heat-radiating unit so that air having passed through the heat-radiating unit via the air inlet duct may be discharged from the airflow channel, and a blower fan disposed in a passage of the air inlet duct to prevent performance deterioration of the blower fan due to heat from the heat-radiating unit and blow external air toward the heat-radiating unit.

The heat-radiating unit may include a plurality of heat-radiating plates which are formed to extend in the same direction as air current in the airflow channel.

The airflow channel may be provided with bypass passages at positions opposite to the air inlet duct and the air outlet duct to decrease air congestion.

As described above, cooling efficiency may be increased by improving the cooling airflow structure. Further, the heat-radiating unit may be easily separated from the cooling device, thereby facilitating removal of foreign matter from the heat-radiating unit.

In addition, noise may be reduced by positioning the blower fan apart from the heat-radiating unit. Further, cooling efficiency may be enhanced by improving the airflow passage so that cooling air may be concentrated at the heat-radiating unit.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
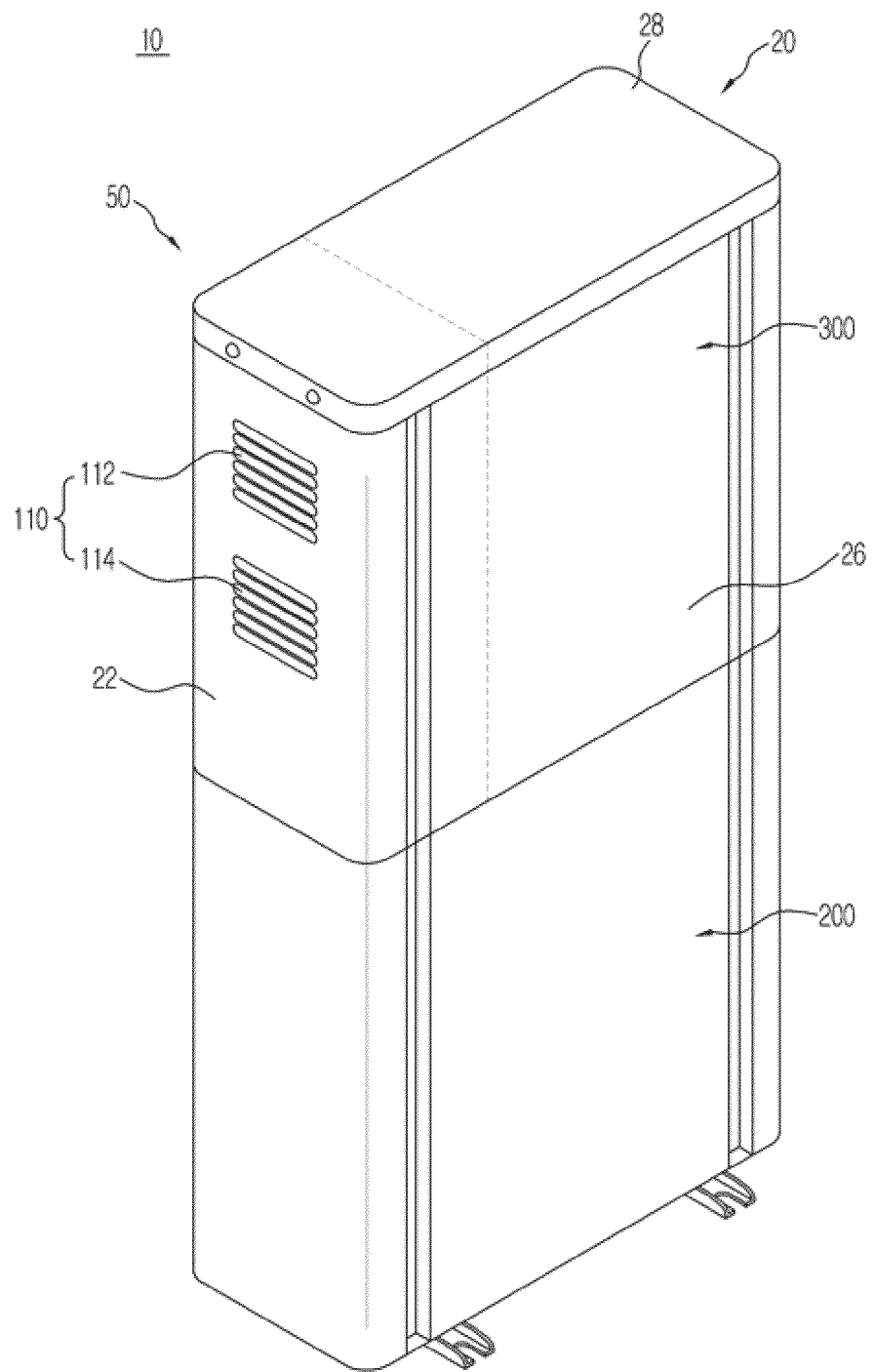
FIG. 1 is a perspective view of an air conditioner according to an embodiment of the present disclosure.

Reference will now be made in detail to embodiments of the present disclosure, examples of which are illustrated in the accompanying drawings, wherein like reference numerals refer to like components throughout.

Figure 2:
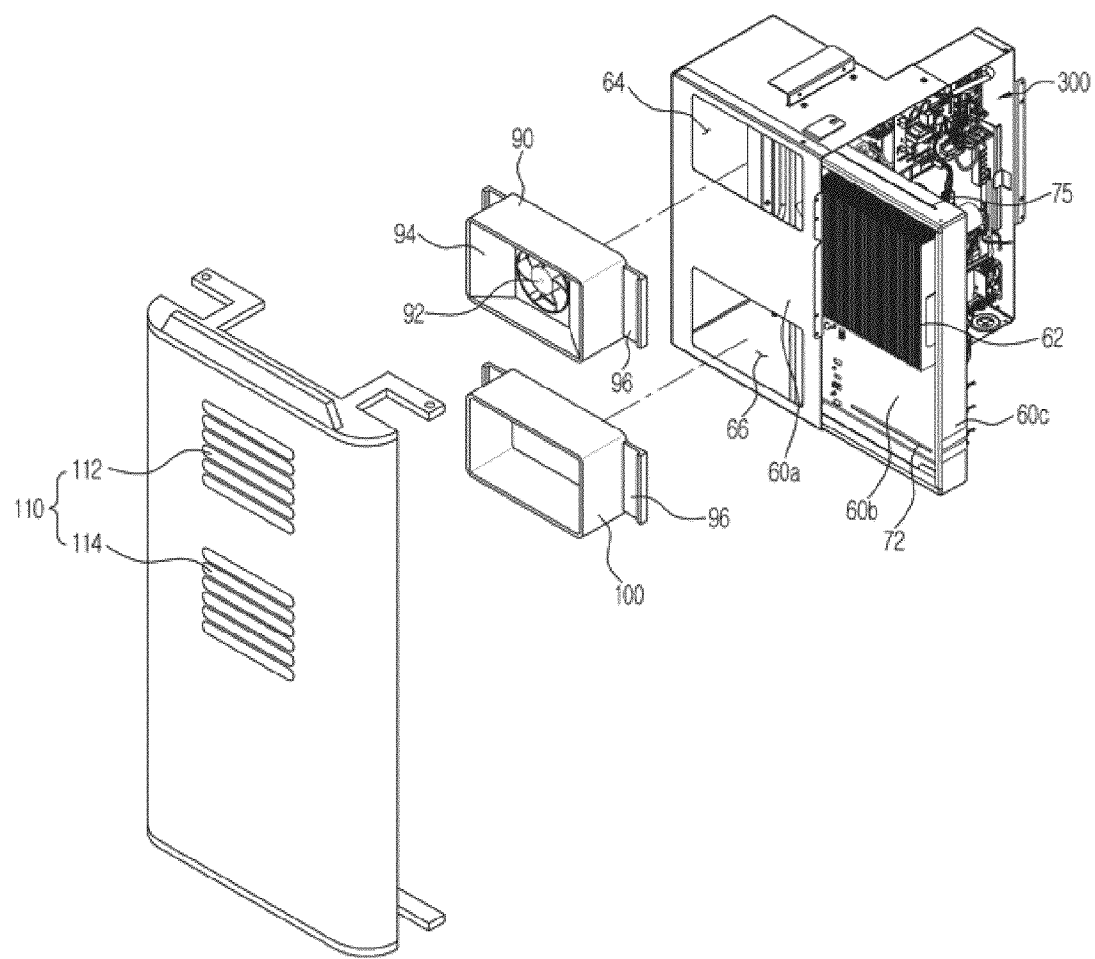
FIG. 2 is an exploded perspective view of a cooling device for an electronic machine according to an embodiment of the present disclosure.
Figure 3:
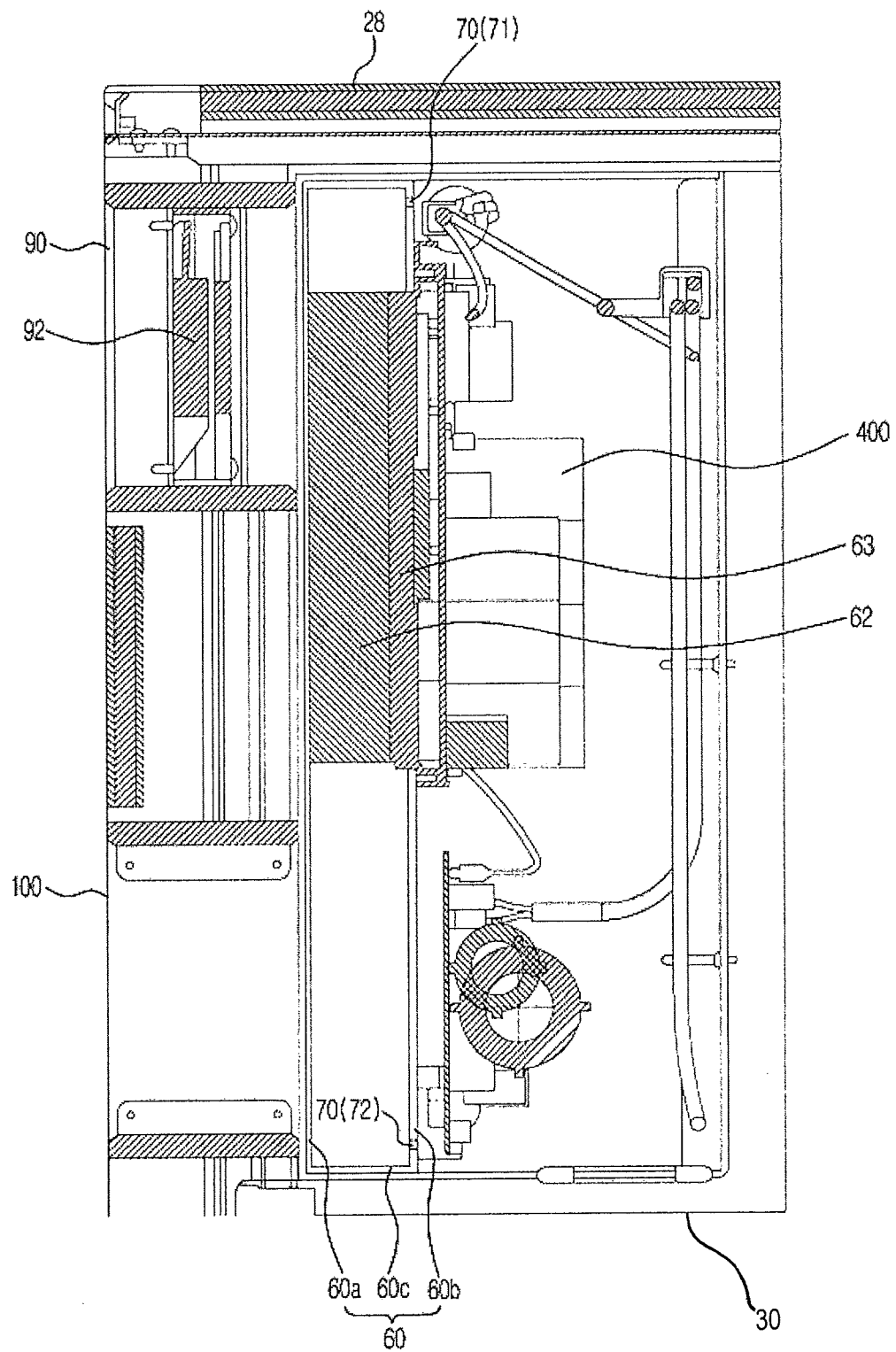
FIG. 3 is a sectional view of the cooling device for an electronic machine according to an embodiment of the present disclosure.

FIG. 1 is a perspective view of an electronic machine according to an embodiment of the present disclosure, FIG. 2 is an exploded perspective view of a cooling device for an electronic machine according to an embodiment of the present disclosure, and FIG. 3 is a sectional view of the cooling device for an electronic machine according to the embodiment of the present disclosure.

A cooling device 50 for an electronic machine according to an embodiment of the present disclosure is provided at an electronic machine, such as an air conditioner 10, a boiler, or the like, which is equipped with a control box 300 containing various electronic components. In this embodiment, the cooling device 50 serves to cool a circuit board 400, such as an inverter circuit, in the control box 300 of the air conditioner 10. Although this exemplary embodiment will be explained for convenience of explanation, the cooling device 50 is not limited to this embodiment. The cooling device 50 may be applied to various other electronic machines equipped with a control box and a circuit board.

The air conditioner 10 includes a main body 20, a heat pump 200, a control box 300, and a cooling device 50. The heat pump 200 generates heat through heat-exchange between refrigerants. The heat pump 200 is disposed at a lower portion of the main body 20. The control box 300 detects a temperature of the air conditioner 10, and controls the temperature. The control box 300 is disposed above the heat pump 200.

The control box 300 contains various electronic components. For example, a circuit board 400 may require continuous cooling by the cooling device 50, in order to prevent an accidental shutdown or malfunction of the electronic machine due to overheating of the circuit board 400.

The cooling device 50 includes an airflow channel 60 through which external air passes, an air inlet duct 90 disposed at an upper front surface of the airflow channel 60 and arranged perpendicularly to the airflow channel 60, through which external air is introduced, a blower fan 92 disposed in the air inlet duct 90 to draw in external air, an air outlet duct 100 disposed at a lower portion of the airflow channel 60, through which air having passed through the airflow channel 60 is discharged, and a heat-radiating unit 62 disposed to the rear portion of the circuit board 400 mounted with electronic components on a front surface thereof to absorb heat generated from the circuit board 400 and located, apart from the blower fan 92, in a passage of the airflow channel 60.

The main body 20 includes a front panel 22 which is in contact with the air inlet duct 90 and the air outlet duct 100, a rear panel 24 integrally formed with a rear plate 60b of the airflow channel 60, side panels 26 connecting the front panel 22 and the rear panel 24, a top panel 28, and a bottom panel 30.

The airflow channel 60 has a rectangular cross-section, however, the airflow channel 60 is not limited to this configuration. That is, the airflow channel 60 is formed in a pipe shape having a rectangular cross-section, and includes a front plate 60a provided with the air inlet duct 90 and the air outlet duct 100, a rear plate 60b provided with the heat-radiating unit 62, and a side plate 60c connecting the front plate 60a and the rear plate 60b.

An air inlet port 64 is formed at an upper portion of the airflow channel 60, and an air outlet port 66 is formed at a lower portion of the airflow channel 60. The air inlet duct 90 is coupled to the air inlet port 64 via installation parts 96 extended from outer portion of the air inlet duct 90, and the air outlet duct 100 is coupled to the air outlet port 66 via installation parts 96 extended from outer portion of the air outlet duct 100. The air inlet duct 90 and the air outlet duct 100 are arranged perpendicularly to an extending direction of the airflow channel 60.

The air inlet duct 90 is disposed at an upper portion of the front plate 60a of the airflow channel 60, perpendicularly to the extending direction of the airflow channel 60. Although there is no limitation (e.g., a circular shape, a rectangular shape, or the like) as to the cross-sectional shape of the air inlet duct 90, the air inlet duct 90 in this embodiment has a rectangular cross-section in consideration of the shape of the airflow channel 60.

The blower fan 92 is disposed in the air inlet duct 90 in order to draw in external air. Because the blower fan 92 has an overall circular shape, the rectangular-shaped air inlet duct 90 is provided with an air inlet guide member 94. The air inlet guide member 94 is formed by extending from an inner surface of the air inlet duct 90 to a region near a periphery of blades of the blower fan 92, to thereby guide external air to be drawn to the blades of the blower fan 92. However, if the air inlet duct 90 has a circular cross-section, the air inlet guide member 94 may not be necessary. While the blower fan 92 is disposed in the air inlet duct 90, the blower fan 92 is located apart from the airflow channel 60.

If a distance between the blower fan 92 and the heat-radiating unit 62 (object to be cooled) is relatively short, noise may be generated. Because the blower fan 92 is located apart from the airflow channel 60 to avoid contact with the heat-radiating unit 62, noise may be reduced.

An external air temperature sensor 80 (not shown) is provided in the passage of the air inlet duct 90. The external air temperature sensor 80 detects a temperature of external air drawn into the cooling device 50, and functions as a component for temperature control of the air conditioner 10. Although the external air temperature sensor 80 is not exposed outside, the external air temperature sensor 80 is disposed in front of the blower fan 92 so as to detect an external temperature, thereby enabling operation of the air conditioner 10 to be controlled.

The air outlet duct 100 is disposed at a lower portion of the airflow channel 60, through which air heated after passing through the heat-radiating unit 62 of the airflow channel 60 is discharged. The air outlet duct 100 is arranged perpendicular to the airflow channel 60.

Figure 4:
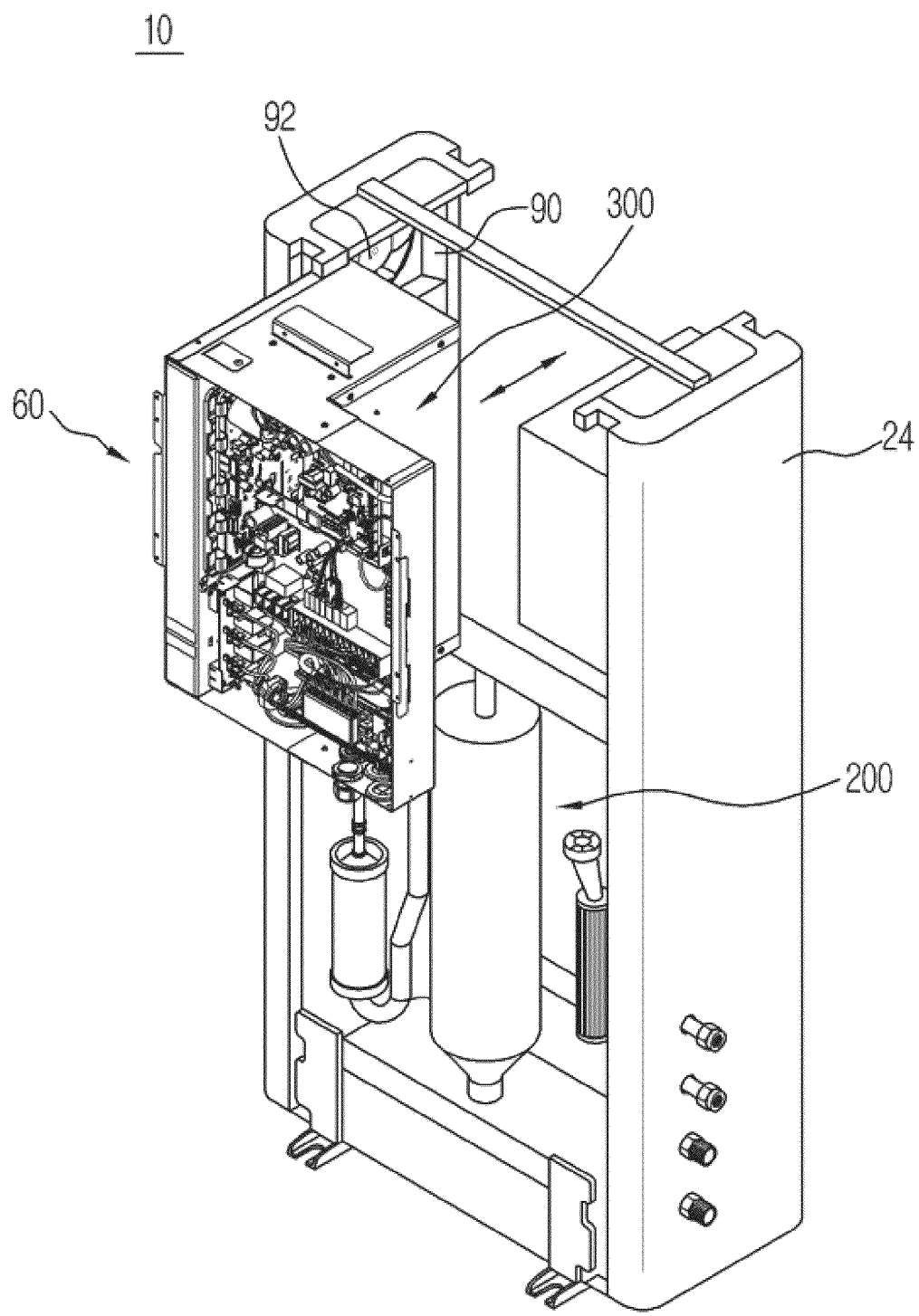
FIG. 4 is a view illustrating a coupling structure of the cooling device for an electronic machine according to an embodiment of the present disclosure.

FIG. 4 is a view illustrating a coupling structure of the cooling device for an electronic machine according to an embodiment of the present disclosure. The air inlet duct 90 and the air outlet duct 100 are coupled to the front panel 22, and the control box 300 and the airflow channel 60 are sliding-coupled to the side panel of the main body. Through the sliding-coupling process, the air inlet port 64 and the air outlet port 66 of the airflow channel 60 are respectively located at positions corresponding to the air inlet duct 90 and the air outlet duct 100. The air inlet duct 90 and the air outlet duct 100 have flanges formed at end portions thereof directed toward the air inlet port 64 and the air outlet port 66, so as to be in contact with the front plate 60a of the airflow channel 60.

The heat-radiating unit 62 is located at the rear plate 60b of the airflow channel 60. The heat-radiating unit 62 is also disposed to the rear of the circuit board 400 mounted with electronic components on a front surface thereof to absorb heat generated from the circuit board 400, and is located in the passage of the airflow channel 60. That is, the circuit board 400 is located at an outer surface of the rear plate 60b of the airflow channel 60, and the heat-radiating unit 62 is located inside the airflow channel 60. The heat-radiating unit 62 is removably mounted to the rear of the circuit board 400. The rear plate 60b of the airflow channel 60 is formed with an opening having a size corresponding to the circuit board 400, and the circuit board 400 is mounted to the rear plate 60b using the opening and screws.

The heat-radiating unit 62 is located apart from the blower fan 92 of the air inlet duct 90. This is because, if the heat-radiating unit 62 is in contact with the blower fan 92, heat generated from the heat-radiating unit 62 may deteriorate the lifespan and performance of the blower fan 92, or blowing efficiency of the blower fan 92 may be decreased as a blowing distance becomes short. Accordingly, the heat-radiating unit 62 is located apart from the blower fan 92 disposed in the air inlet duct 90 by a predetermined distance. The distance between the heat-radiating unit 62 and the blower fan 92 may be changed according to a blowing capacity of the blower fan 92 or a size of the airflow channel.

In order to rapidly absorb heat from the circuit board 400 and radiate the heat outside, the heat-radiating unit 62 may be made of a material having high thermal conductivity and may be formed to have a large surface area. In an embodiment, the heat-radiating unit 62 includes a plurality of heat-radiating plates 65. Each of the plurality of heat-radiating plates 65 is formed to extend in the same direction as the air current in the airflow channel 60, in order to minimize hindrance to the air current and increase the amount of heat radiation.

Figure 5:
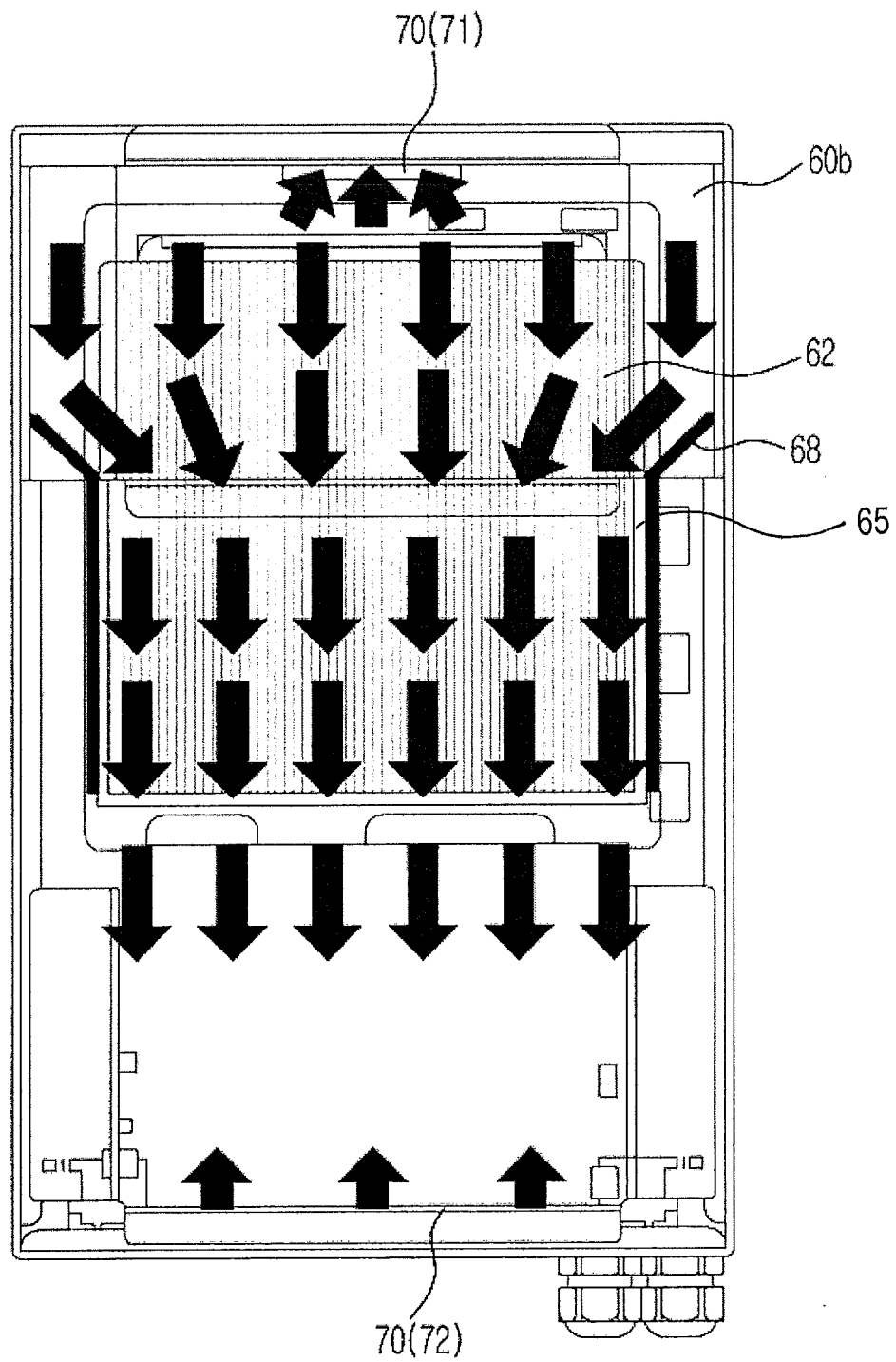
FIG. 5 is a front view of an airflow channel of the cooling device for an electronic machine according to an embodiment of the present disclosure.

FIG. 5 is a view illustrating the inside of the airflow channel 60 of the cooling device for an electronic machine according to an embodiment of the present disclosure.

The heat-radiating unit 62 is disposed to the rear of the circuit board 400, and the heat-radiating unit 62 and the circuit board 400 are coupled using a coupling member 63. The heat-radiating unit 62 may be arranged in the same configuration as the cross-sectional shape of the airflow channel 60. That is, the inner wall of the airflow channel 60 is shaped to envelop the plurality of heat-radiating plates 65. Accordingly, all of the air flowing in the airflow channel 60 passes through the heat-radiating unit 62, thereby maximizing heat radiating efficiency.

In a section at which the cross-section of the heat-radiating unit 62 in a perpendicular direction to the air current in the airflow channel 60 is smaller than the cross-section of the airflow channel 60, a guide member 68 is provided near each side surface of the heat-radiating unit 62, that is, formed to extend from the side plate 60c of the airflow channel 60 to the heat-radiating unit 62, thereby increasing airflow efficiency.

Figure 6:
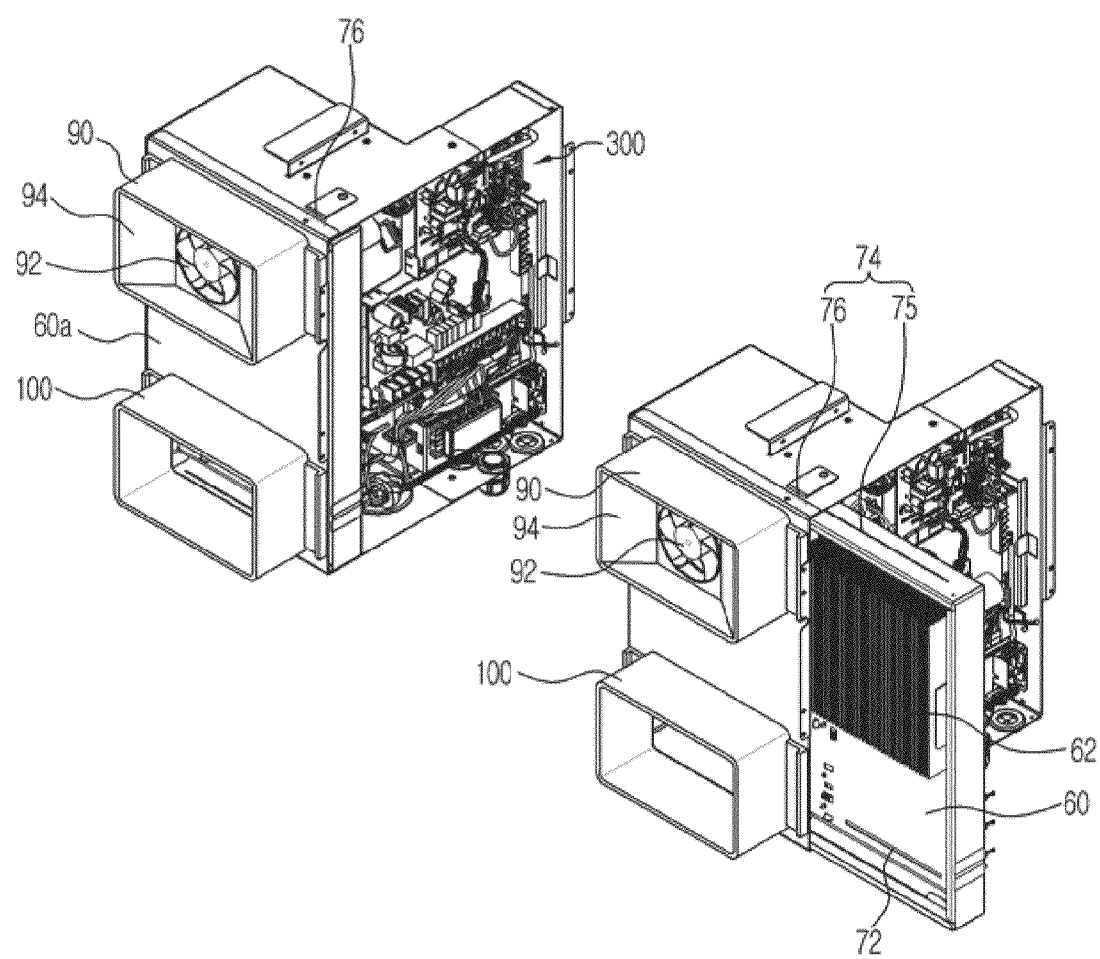
FIG. 6 is a perspective view illustrating a sliding-coupled state of a rear plate of the airflow channel in the cooling device for an electronic machine according to an embodiment of the present disclosure.

FIG. 6 is a perspective view illustrating a sliding-coupled state of the rear plate of the airflow channel in the cooling device for an electronic machine according to the embodiment of the present disclosure.

The rear plate 60b of the airflow channel 60, which is mounted with the heat-radiating unit 62 and the circuit board 400, is provided with sliding units 74 at a top end portion and a bottom end portion thereof. Through sliding movement, the heat-radiating unit 62 and the circuit board 400 may be exposed outside without disassembly of the cooling device 50. Accordingly, repair, replacement, or cleaning of the circuit board 400 and the heat-radiating unit 62 may be easily accomplished.

Each of the sliding units 74 may include a roller guide provided at one portion and a roller provided at the other portion to slide along the roller guide. In this embodiment, each of the sliding units 74 includes a sliding recess 75 and a protruding part 76. In detail, the sliding recess 75 is formed at each of the top and bottom ends of the rear plate 60b, and extends in a sliding-coupled direction. The protruding part 76 is provided at each of the upper and lower panels supporting the rear plate 60b, and is configured to slide along the sliding recess 75.

Figure 7:
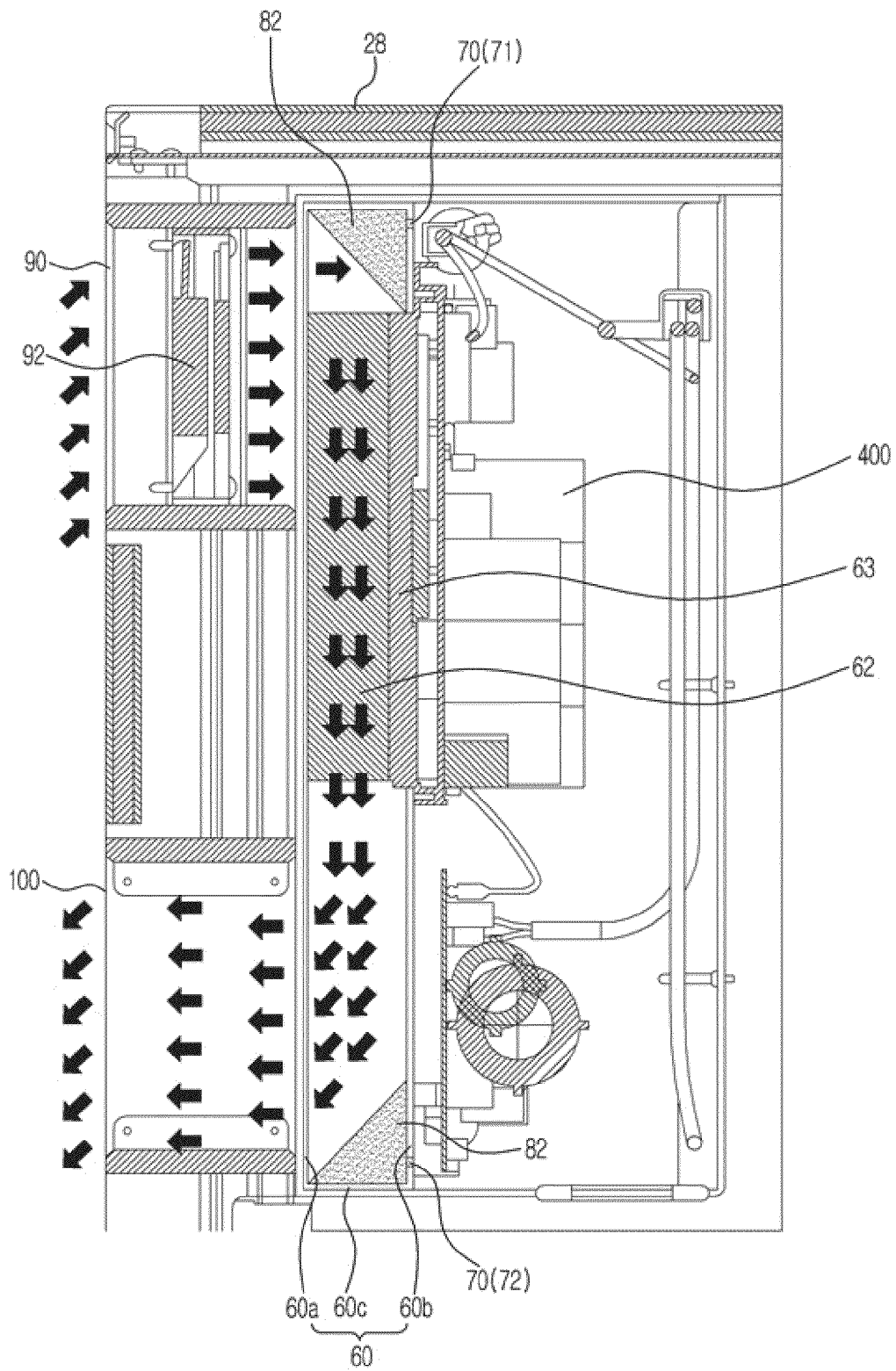
FIG. 7 is a view illustrating air current when bypass passages are not provided at the cooling device for an electronic machine according to an embodiment of the present disclosure.
Figure 8:
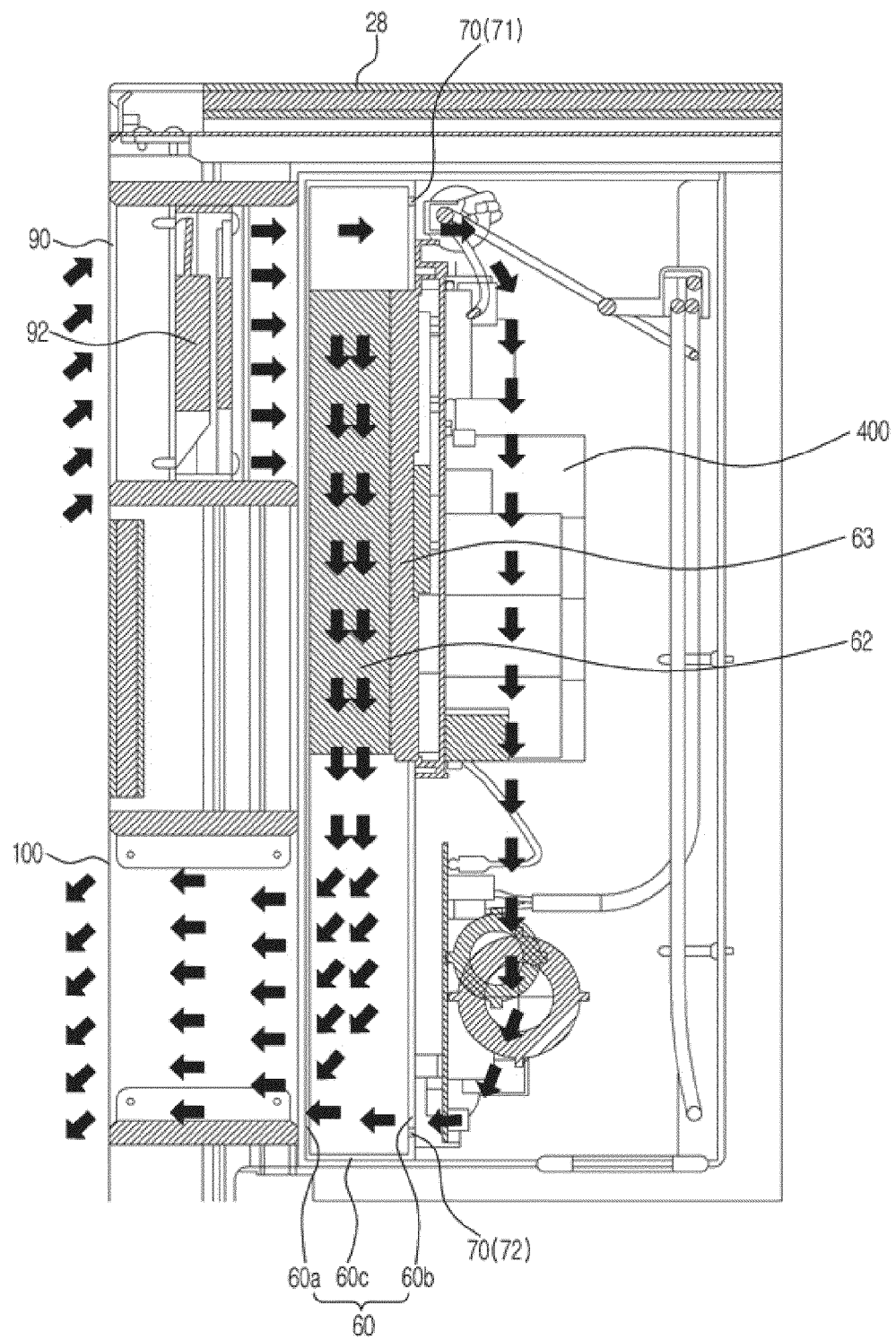
FIG. 8 is a view illustrating air current when the bypass passages are provided at the cooling device for an electronic machine according to an embodiment of the present disclosure.

FIG. 7 is a view illustrating air current when bypass passages are not provided at the cooling device for an electronic machine according to an embodiment of the present disclosure, and FIG. 8 is a view illustrating air current when bypass passages are provided at the cooling device for an electronic machine according to the embodiment of the present disclosure Bypass passages 70 are formed at the upper and lower portions of the airflow channel 60, and are positioned opposite to the air inlet port 64 and the air outlet port 66. External air introduced through the air inlet duct 90 is discharged outside through the air outlet duct 100 via the heat-radiating unit 62 of the airflow channel 60. Because the air inlet duct 90 and the air outlet duct 100 are arranged perpendicularly to the airflow channel 60, congested flow areas 82 may be generated at the upper and lower portions of the airflow channel 60. Because the air current and heat are congested in the congested flow areas 82, cooling efficiency of the cooling device 50 may be decreased. In order to prevent this congested flow phenomenon, the bypass passages 70 are formed at the airflow channel 60, to thereby allow the air in the congested flow areas 82 to flow into and out of the control box 300, thus ensuring smooth flow of air.

As described above, the bypass passages 70 are formed at the upper and lower portions of the airflow channel 60. In detail, the bypass passages 70 are formed at the upper and lower portions of the rear plate 60b, and extend longitudinally in a perpendicular direction to the extending direction of the airflow channel 60.

The bypass passages 70 include an inlet bypass passage 71 positioned opposite to the air inlet port 64, and an outlet bypass passage 72 positioned opposite to the air outlet port 66. In order to prevent the external air introduced through the air inlet duct 90 from excessively flowing into the inlet bypass passage 71 instead of flowing toward the heat-radiating unit 62, the inlet bypass passage 71 is located at a position higher than or equal to the top end portion of the air inlet duct 90.

In order to prevent the air discharged through the air outlet duct 100 from the airflow channel 60 from flowing back into the control box 300 through the outlet bypass passage 72, the outlet bypass passage 72 is located at a position lower than or equal to the bottom end portion of the air outlet duct 100.

Through this structure, a small amount of external air introduced through the inlet bypass passage 71 flows through the control box 300, and is discharged through the outlet bypass passage 72. Accordingly, the congested flow areas 82 are eliminated.

FIGS. 9A, 9B, 9C and 9D are views illustrating air current according to positions of louvers 110, the air inlet duct 90, the air outlet duct 100, and the blower fan 92 in the cooling device for an electronic machine.

The louvers 110 are provided at the front panel 22, and are located at positions corresponding to the air inlet duct 90 and the air outlet duct 100. When the air conditioner 10 is installed outdoors, rainwater may penetrate the air conditioner 10. In order to prevent rainwater from entering the air conditioner 10 and to permit external air to be drawn into and discharged from the air conditioner 10, the louvers 110 are disposed at junctional points between the air inlet duct 90 and the front panel 22 and between the air outlet duct 100 and the front panel 22.

The louvers 110 include a first louver 112 disposed near the air inlet duct 90, and a second louver 114 disposed near the air outlet duct 100. Because the louvers 110 extend outward and are slanted downward, rainwater flows down along the louvers 110, and only external air is drawn into and discharged from the air conditioner 10.

Figures 9A, 9B, 9C, 9D:
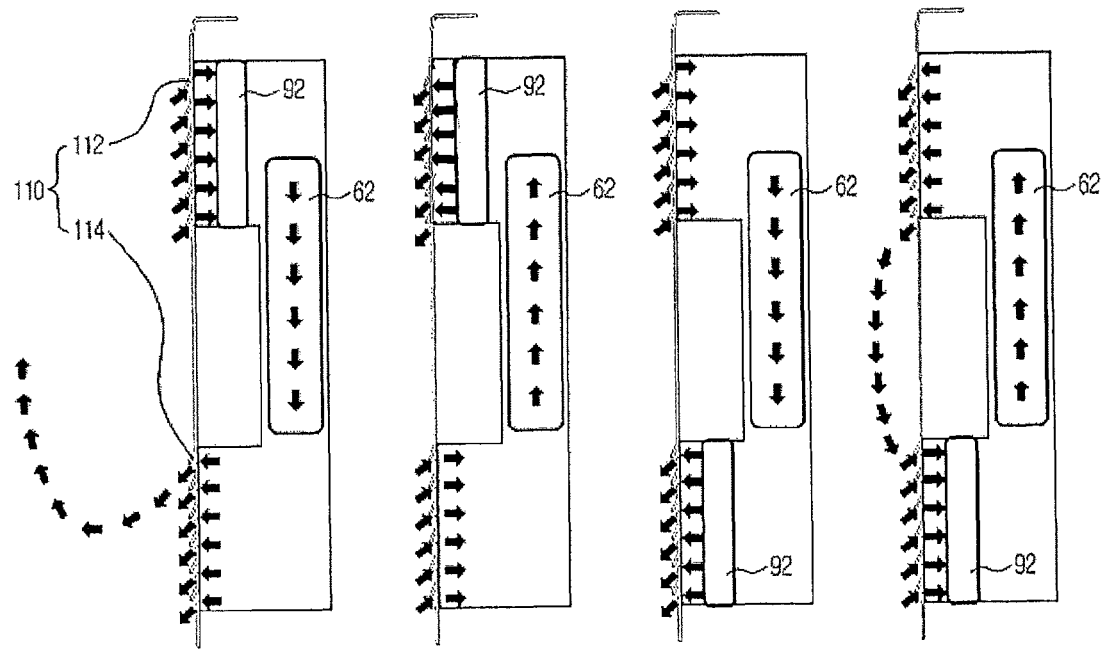
FIGS. 9A, 9B, 9C and 9D are views illustrating air current according to positions of louvers, an air inlet port and a blower fan in the cooling device for an electronic machine according to an embodiment of the present disclosure.

The louvers 110, the blower fan 92, and the heat-radiating unit 62 may be arranged in four configurations as exemplarily shown in FIGS. 9A through 9D, in consideration of relations therebetween. FIG. 9A illustrates a structure in which the blower fan 92 is positioned at the upper portion of the airflow channel 60 and external air is drawn into the airflow channel 60 by the blower fan 92. FIG. 9B illustrates a structure in which the blower fan 92 is positioned at the upper portion of the airflow channel 60 and internal air is discharged from the airflow channel 60 by the blower fan 92. FIG. 9C illustrates a structure in which the blower fan 92 is positioned at the lower portion of the airflow channel 60 and internal air is discharged from the airflow channel 60 by the blower fan 92. FIG. 9D illustrates a structure in which the blower fan 92 is positioned at the lower portion of the airflow channel 60 and external air is drawn into the airflow channel 60 by the blower fan 92.

In the structures illustrated in FIGS. 9B and 9C, air heated by the heat-radiating unit 62 directly passes through the blower fan 92, and then is discharged outside. Thus, deterioration of the lifespan and performance of the blower fan 92 may occur. In the structure illustrated in FIG. 9D, because the heated air discharged from the first louver 112 is drawn back into the second louver 114, cooling efficiency is decreased.

In the structure illustrated in FIG. 9A, because the discharged hot air is not drawn back and deterioration of the lifespan and performance of the blower fan 92 due to the heated air does not occur, cooling efficiency is higher than in any other structure. Therefore, the embodiment of the present disclosure is structured such that the blower fan 92, the heat-radiating unit 62, and the louvers 110 are arranged as illustrated in FIG. 9A. However, the structures illustrated in FIGS. 9B through 9D may also be applied to other modified embodiments. Further, although not shown, one or more blower fan may be provided to flow the air. For example, in FIG. 9, an additional blower fan may be positioned at the lower portion of the air flow channel 60 to discharge the heated air to the outside.

Figure 10:
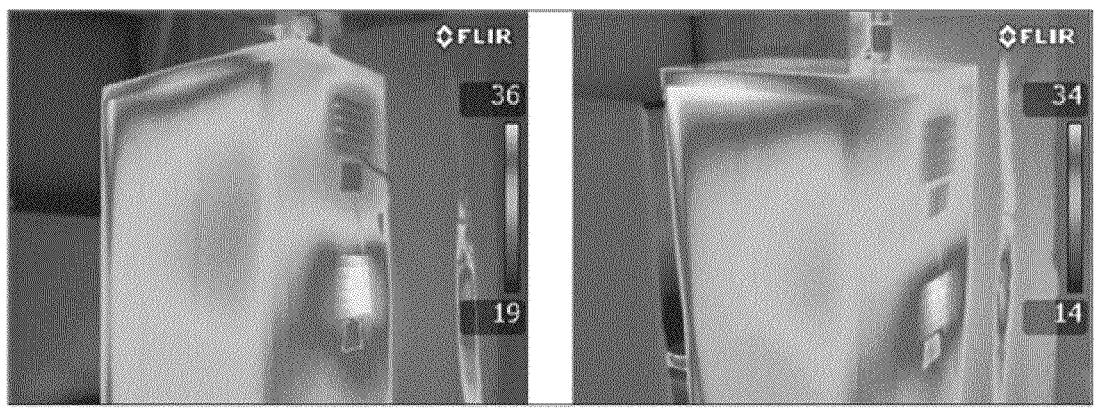
FIG. 10 is a view showing heat distribution by operation of the cooling device for an electronic machine according to an embodiment of the present disclosure.

FIG. 10 is a view showing heat distribution by operation of the cooling device for an electronic machine according to an embodiment of the present disclosure.

According to experiments, the first louver 112 through which external air is drawn in has a temperature of about 20° C., which is identical to a temperature of external air. The air discharged through the second louver 114 via the blower fan 92, the heat-radiating unit 62 and the air outlet duct 100 has a temperature of about 30° C. or more. Since the blower fan 92 is disposed in the air inlet duct 90, the blower fan 92 is not affected by the heated air, and thus continuous cooling operation is achieved.

Hereinafter, operational effects of the cooling device for an electronic machine as constructed above will be described.

When the air conditioner 10 operates, heat is generated from the control box 300 containing various electronic components, and the heat is transmitted to the heat-radiating unit 62 disposed to the rear of the circuit board 400. However, if airflow toward the heat-radiating unit 62 is not generated, heat is not dissipated from the control box 300, an internal temperature of the control box 300 increases, and accidental shutdown or malfunction of the air conditioner 10 may occur.

The cooling device 50 draws in external air through the air inlet duct 90, and circulates the external air by the blower fan 92. The external air drawn through the air inlet duct 90 passes through the airflow channel 60, and is discharged outside through the air outlet duct 100. During this circulation process, the air absorbs heat from the heat-radiating unit 62 disposed at the airflow channel 60 and discharges the heat outside.

Since the blower fan 92 is located apart from the heat-radiating unit 62, the blower fan 92 is not affected by the air heated by the heat-radiating unit 62, and thus continuous cooling operation is achieved. Accordingly, an internal temperature of the control box 300 in a normal state may be kept low.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A cooling device for an electronic machine comprising:
    an airflow channel through which external air passes;
    an air inlet duct through which external air is introduced and configured to guide the introduced external air in a first direction, the air inlet duct being disposed at an upper front portion of the airflow channel and extending perpendicular to the airflow channel;
    a blower fan disposed in the air inlet duct to draw in external air through the air inlet duct;
    an air outlet duct disposed at a lower portion of the airflow channel to discharge air having passed through the airflow channel to outside and configured to guide the air in a second direction opposite to the first direction; and
    a heat-radiating unit disposed to a rear portion of a circuit board mounted with electronic components on a front surface thereof to absorb heat generated from the circuit board, the heat-radiating unit being located, apart from the blower fan, in a passage of the airflow channel.

2. The cooling device according to claim 1, wherein the heat-radiating unit includes a plurality of heat-radiating plates which are formed to extend in the same direction as air current in the airflow channel.

3. The cooling device according to claim 1, wherein the airflow channel includes a front plate provided with the air inlet duct, a rear plate provided with the heat-radiating unit, and a side plate connecting the front plate and the rear plate, and
    wherein the heat-radiating unit is removably located at the rear plate.

4. The cooling device according to claim 3, wherein the rear plate is provided with sliding units at a top end portion and a bottom end portion thereof for sliding movement sideways.

5. The cooling device according to claim 3, wherein the heat-radiating unit is removably provided over a portion of the rear plate of the airflow channel.

6. The cooling device according to claim 1, wherein the airflow channel has the same cross-sectional shape as the heat-radiating unit.

7. The cooling device according to claim 1, wherein the airflow channel is provided with a guide member near each of side surfaces of the heat-radiating unit to concentrate airflow in the airflow channel onto the heat-radiating unit.

8. The cooling device according to claim 1, wherein the airflow channel is provided with bypass passages at positions opposite to the air inlet duct and the air outlet duct to decrease air congestion.

9. The cooling device according to claim 1, wherein the air inlet duct and the air outlet duct are arranged in parallel with each other.

10. The cooling device according to claim 1, further comprising:
    louvers mounted to the air inlet duct and the air outlet duct to prevent water from entering the airflow channel from the outside.

11. A cooling device for an electronic machine comprising:
    an air inlet pipe through which external air is introduced and configured to guide the introduced external air in a first direction;
    an airflow channel arranged perpendicular to the air inlet pipe;
    an air outlet pipe disposed at a lower portion of the airflow channel to discharge air having passed through the airflow channel and configured to guide the air in a second direction opposite to the first direction; and
    heat sink disposed to a rear portion of a circuit board mounted with electronic components on a front surface thereof to absorb heat generated from the circuit board, the heat sink being enveloped by an inner wall of the airflow channel.

12. The cooling device according to claim 11, further comprising:
    a blower fan disposed in the air inlet pipe to draw external air into the airflow channel.

13. The cooling device according to claim 11, wherein the heat sink includes a plurality of heat-radiating plates which are formed to extend in the same direction as air current in the airflow channel.

14. The cooling device according to claim 12, wherein the heat sink is arranged in parallel with the blower fan.

15. The cooling device according to claim 11, wherein the airflow channel is provided with a guide member near each of side surfaces of the heat sink to concentrate airflow in the airflow channel onto the heat sink.

16. The cooling device according to claim 11, wherein the airflow channel includes a front plate provided with the air inlet pipe, a rear plate provided with the heat sink, and a side plate connecting the front plate and the rear plate, and
    wherein the heat sink is removably located at the rear plate.

17. The cooling device according to claim 16, wherein the rear plate is provided with sliding units at a top end portion and a bottom end portion thereof for sliding movement sideways.

18. The cooling device according to claim 16, wherein the heat sink is removably provided over a portion of the rear plate of the airflow channel.

19. The cooling device according to claim 11, wherein the airflow channel is provided with bypass passages at positions opposite to the air inlet pipe and the air outlet pipe to decrease air congestion.

20. The cooling device according to claim 11, further comprising:
    louvers mounted to the air inlet pipe and the air outlet pipe to prevent water from entering the airflow channel from the outside.

21. A cooling device for an electronic machine comprising:
a heat-radiating unit disposed to a rear portion of a circuit board mounted with electronic components on a front surface thereof;
an airflow channel configured to envelop the heat-radiating unit so that external air flowing in the airflow channel to cool the heat-radiating unit;
an air inlet duct disposed at an upper portion of the airflow channel, through which external air is introduced and configured to guide the introduced external air in a first direction;
an air outlet pipe disposed below the heat-radiating unit so that air having passed through the heat-radiating unit via the air inlet pipe is discharged from the airflow channel and configured to guide the air in a second direction opposite to the first direction and
a blower fan disposed in a passage of the air inlet duct to prevent performance deterioration of the blower fan due to heat from the heat-radiating unit and blow external air toward the heat-radiating unit.

22. The cooling device according to claim 21, wherein the heat-radiating unit includes a plurality of heat-radiating plates which are formed to extend in the same direction as air current in the airflow channel.

23. The cooling device according to claim 21, wherein the airflow channel is provided with bypass passages at positions opposite to the air inlet duct and the air outlet duct to decrease air congestion.

24. The cooling device according to claim 1, wherein the airflow channel is provided with bypass passages which are formed at the upper and lower portions of the rear plate, and extend longitudinally in a perpendicular direction to the extending direction of the airflow channel.

25. The cooling device according to claim 11, wherein the airflow channel is provided with bypass passages which are formed at the upper and lower portions of the rear plate, and extend longitudinally in a perpendicular direction to the extending direction of the airflow channel.

26. The cooling device according to claim 21, wherein the airflow channel is provided with bypass passages which are formed at the upper and lower portions of the rear plate, and extend longitudinally in a perpendicular direction to the extending direction of the airflow channel.

27. The cooling device according to claim 24, wherein the bypass passages include an inlet bypass passage located at a position higher than or equal to the top end portion of the air inlet duct and an outlet bypass passage located at a position lower than or equal to the bottom end portion of the air outlet duct.

28. The cooling device according to claim 25, wherein the bypass passages include an inlet bypass passage located at a position higher than or equal to the top end portion of the air inlet duct and an outlet bypass passage located at a position lower than or equal to the bottom end portion of the air outlet duct.

29. The cooling device according to claim 26, wherein the bypass passages include an inlet bypass passage located at a position higher than or equal to the top end portion of the air inlet duct and an outlet bypass passage located at a position lower than or equal to the bottom end portion of the air outlet duct.

* * * * *